(12) United States Patent
Goren et al.

(10) Patent No.: US 7,308,662 B2
(45) Date of Patent: Dec. 11, 2007

(54) CAPACITANCE MODELING

(75) Inventors: David Goren, Nesher (IL); Shlomo Shlafman, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 254 days.

(21) Appl. No.: 11/153,047

(22) Filed: Jun. 15, 2005

(65) Prior Publication Data
US 2006/0286691 A1 Dec. 21, 2006

(51) Int. Cl.
G06F 17/50 (2006.01)
H01L 21/66 (2006.01)

(52) U.S. Cl. .................. 716/5; 716/1; 716/4; 438/18

(58) Field of Classification Search ............. 716/1, 716/4, 5; 438/18; 702/64, 65
See application file for complete search history.

(56) References Cited

U.S. PATENT DOCUMENTS

| | | | | |
|---|---|---|---|---|
| 5,490,083 | A * | 2/1996 | Toyonaga et al. | 716/4 |
| 6,028,990 | A * | 2/2000 | Shahani et al. | 716/8 |
| 6,285,208 | B1 * | 9/2001 | Ohkubo | 326/15 |
| 7,188,038 | B2 * | 3/2007 | Picollet et al. | 702/65 |
| 2003/0217344 | A1 * | 11/2003 | Ito et al. | 716/6 |
| 2005/0114819 | A1 | 5/2005 | Goren et al. | |

OTHER PUBLICATIONS

Bansal,A, et al. "Modeling and Optimization of Fringe Capacitance of Nanoscale DGMOS Devices" IEEE Transactions on Electron Devices, vol. 52, No. 2, Feb. 2005, pp. 256-262.*

Goren, D. et al., "An Interconnect-Aware Methodology for Analog and Mixed Signal Design, Based on High Bandwidth (Over 40 GHz) On-Chip Transmission Line Approach", IEEE Date '02 Conference, Parish, Mar. 2002, pp. 804-811.

Goren, D. et al., "On-Chip Interconnect-Aware Design and Modeling Methodology, Based on High Bandwidth Transmission Line Devices", IEEE DAC '03 Conference, CA, Jun. 2003, pp. 724-727.

He, Lei, "Modeling and Optimization for VLSI Layout", UCLS, Microsoft PowerPoint 1997.

W. H. Chang, "Analytical IC Metal-Line Capacitance Formulas," IEEE Transactions on Microwave Theory and Techniques, Sep. 1976, pp. 608-611.

G. Polya, et al., "Isoperimetric Inequalities in Mathematical Physics", Princenton, Princenton University Press, 1951, Section 1.29, p. 49 (translation included).

* cited by examiner

Primary Examiner—Jack Chiang
Assistant Examiner—Magid Y. Dimyan

(57) ABSTRACT

A method of modeling capacitance for all practical 2D on-chip wire structures including coplanar and microstrip structures. The method includes using a field lines approach (600) to obtain capacitance expressions for structure components, combining the expressions (704) for components of the subject structure and obtaining a capacitance expression (705) for the subject structure. The static capacitance matrix for the structure is calculated from the capacitance expression. The structure components can include components with parallel plate field lines, quarter circle field lines, singularity field lines, singularity field lines with restriction, double set of quarter circle field lines which are used as building blocks for the subject structure. The final capacitance expressions can be used for the modeling of critical on-chip wires and devices as well as inside a capacitance extraction tool.

3 Claims, 16 Drawing Sheets

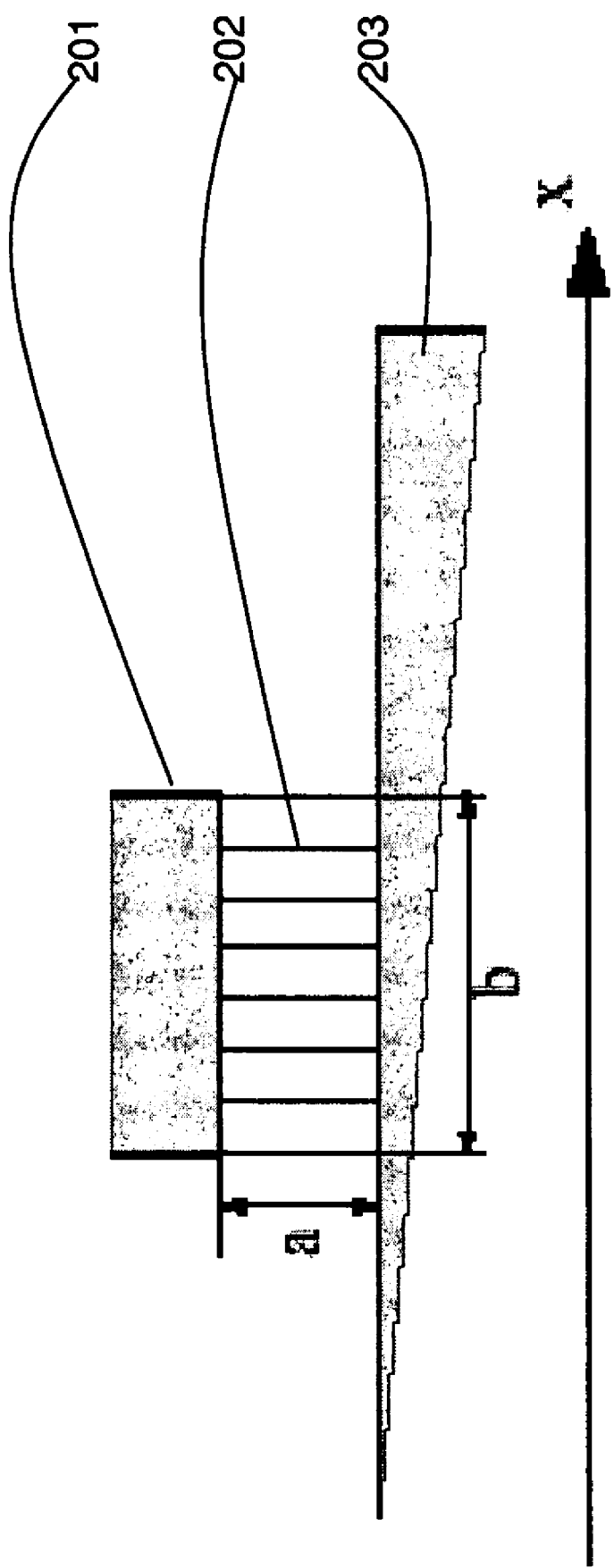

CAPACITANCE MODELING

TECHNICAL FIELD

The present invention relates to the field of modeling capacitance. In particular, the invention relates to modeling and extraction of capacitance of wires in integrated circuits; specifically, modeling capacitance of on-chip transmission lines.

BACKGROUND OF THE INVENTION

Models of on-chip transmission lines have been developed as a part of the "T-lines set" which is the core of an interconnect-aware design and modeling methodology, enabling high predictability of the critical interconnect behaviour. Further information is provided in references: Goren, D. et al., "An Interconnect-Aware Methodology for Analog and Mixed Signal Design, Based on High Bandwidth (Over 40 GHz) On-chip Transmission Line Approach" IEEE DATE'02 Conference, Paris March 2002, pp. 804-811 and Goren, D. et al., "On-chip Interconnect-Aware Design and Modeling Methodology, Based on High Bandwidth Transmission Line Devices", IEEE DAC'03 Conference, CA, June 2003, pp. 724-727.

During the extraction of the wire models in integrated circuits and in the modeling of on-chip transmission lines, it is necessary to calculate the static capacitance of the interconnect structures.

There have been numerous prior solutions to this problem. The most common solution is to build a database of solutions (a look-up table) using a numerical electromagnetic solver, and then to interpolate between these solutions using polynomial functions.

The drawbacks of this prior art solution are as follows.

1) The interpolation is quite approximate, and its validity is severely limited to the range of geometries used in the numerical database. As a special case of this, polynomial interpolations fail to give the correct asymptotic results for the extreme cases (very wide line, very thick line, etc.).

2) It is very time consuming to build and run the numerical database repeatedly when using the models for a different silicon chip technology with different wire cross sectional dimensions and often with multiple metal stack options.

In addition to this, there have been several efforts in the past to develop expressions for the capacitance in the common cases of VLSI designs (Very Large Scale Integration designs). The main drawback of these solutions is that they are not physics based, and rather use several known functions (such as logarithmic functions, power functions, etc.) which limits their range of applicability.

Semi-analytical modeling is a very cost-effective method, compared with both the lookup table method and the numerical simulation method. The semi-analytical method is a method which uses closed form explicit expressions whose result approximates the exact result.

A semi-analytic solution is disclosed in Lei He, "Modeling and Optimization for VLSI Layout", UCLA, Microsoft PowerPoint 1997. However, this solution lacks flexibility since it is restricted to some specific cases and cannot be simply extended to include other structures.

Only in few restricted cases it is possible to get the analytical solution (for example, W. H. Chang, "Analytical IC Metal-Line Capacitance Formulas." IEEE Transactions on Microwave Theory and Techniques, September 1976, pp. 608-611 for single signal line without side shields) which results in much more complicated expressions compared with a semi-analytical approach.

An aim of the present invention is to provide capacitance modeling using semi-analytical methods which can be applied to a range of different structures.

The proposed method has the advantage over other semi-analytical methods, in that it is not based on arbitrary functions (such as power functions, logarithm functions, etc) which are usually generated to approximate the real behavior. The proposed method is based on a field lines approach which is built on physics-based approximations for electric field lines from which the resulting expressions are formally derived.

The proposed method introduces a set of semi-analytical formulations for 2D modeling of typical on-chip interconnect line structures. The method may be applied to on-chip interconnect wire structures including the consideration of the crossing lines effect which are modeled as a solid metal plane layer. This set of interconnect lines covers most typical needs of both VLSI designs and typical RF designs. These explicit expressions can be used both for the modeling of selected critical lines, or as part of a post layout RC extraction tool.

The proposed method solves the problem of calculating the static capacitance matrix for the main common cases found in typical VLSI chip designs.

SUMMARY OF THE INVENTION

According to a first aspect of the present invention there is provided a method of modeling capacitance for a subject structure, comprising: using a field lines approach to obtain capacitance expressions for structure components; combining the expressions for components of the subject structure; obtaining a capacitance expression for the subject structure.

Preferably, the method includes calculating the static capacitance matrix for the structure from the capacitance expressions.

The step of using a field lines approach to obtain capacitance expressions for structure components may include: drawing approximate field lines for the structure component; calculating the length of each field line; assuming that the electric field along the field line is constant or has a linear variation; calculating the charge of a defined area; calculating the capacitance per unit length of a wire.

The structure components may include components with parallel plate field lines, quarter circle field lines, singularity field lines, singularity field lines with restriction, double set of quarter circle field lines which are used as building blocks to make up the subject structure.

The subject structure is preferably a coplanar or microstrip on-chip interconnect structure, which may have crossing lines which are modeled as solid plates. If the subject structure has two-ground crossing lines, the method may include dividing the subject structure into two one-ground auxiliary structures and obtaining a capacitance expression for one auxiliary structure. A linear crossing capacitance factor may be provided to estimate the density of crossing lines in a subject structure.

The method may include deriving capacitance expressions for subject structures with single signal line without side shields, single signal line with side shields, two coupled signal lines without side shields, and two coupled signal lines with side shields.

The method may also include fitting the capacitance expression to exact EM solver results for a subject structure to improve accuracy. The step of fitting may be performed by adding factors to the capacitance expressions for the structural components.

This process of fitting can either be performed again for each and every silicon chip technology for obtaining maximal accuracy, or it can be performed for a generalised global metallization stack that covers the specific cases of a large variety of existing silicon chip technologies.

The fitting may be performed for a generalized structure covering a range of subject structures. A mathematical space created by variations to the generalized structure may be divided into a plurality of sub-spaces and fitting of the capacitance expressions may be carried out for each sub-space.

According to a second aspect of the present invention there is provided an integrated circuit design system including means for modeling capacitance for a subject structure, comprising: means for obtaining capacitance expressions for structure components using a field lines approach; means for combining the expressions for components of the subject structure; and means for obtaining a capacitance expression for the subject structure.

According to a third aspect of the present invention there is provided a computer program product stored on a computer readable storage medium, comprising computer readable program code means for modeling capacitance for a subject structure, comprising code means for performing the steps of: using a field lines approach to obtain capacitance expressions for structure components; combining the expressions for components of the subject structure; and obtaining a capacitance expression for the subject structure.

DESCRIPTION OF PREFERRED EMBODIMENTS

Embodiments of the present invention will now be described, by way of examples only, with reference to the accompanying drawings in which:

FIGS. 2A to 2E are five basic field line patterns used in accordance with the present invention;

Figure 1:
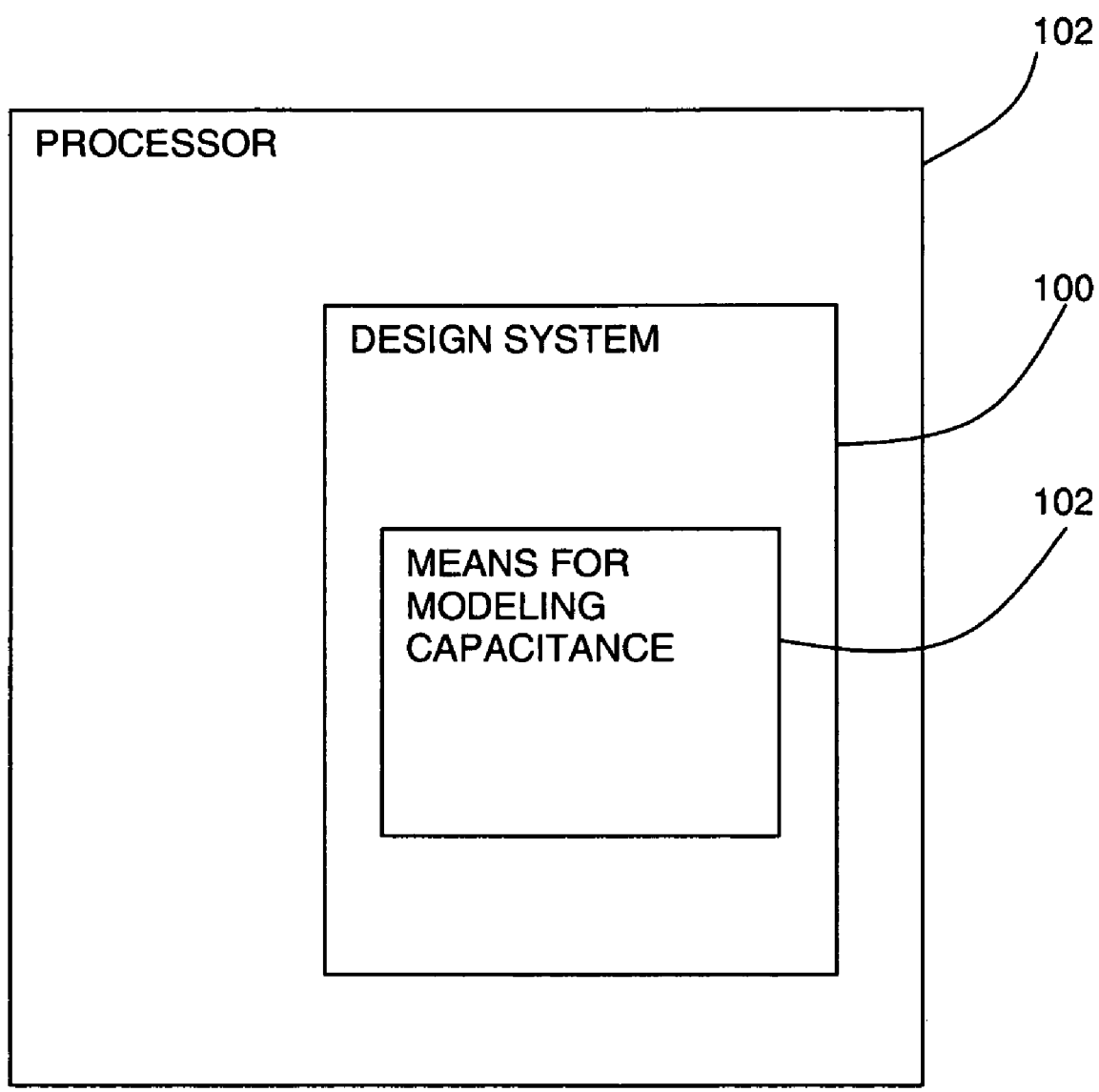
FIG. 1 is a schematic representation of an integrated circuit design system for implementing a design process including modeling capacitance in accordance with the present invention.

Referring to FIG. 1, a schematic representation of an integrated circuit design system 100 for implementing a design process including modeling capacitance is provided. The design system 100 is implemented by specialized CAD software running on a computer processor 102 providing an interface with a designer. The designer controls the design process by appropriate inputs to the system 100.

The IC design system 100 includes a means for modeling capacitance 104 for carrying out the steps of the method described below. The means for modeling capacitance 104 may be provided in the form of a computer program product.

An IC design flow which employs modeling of the critical on-chip wires is disclosed in detail in U.S. patent application Ser. No. 10/723,752 for "Interconnect-Aware Integrated Circuit Design" (published as US2005/0114819). The present invention can be used both for wire capacitance modeling in this last context and for the more commonly used capacitance extraction methodology and tools.

A method for the calculation of static capacitance by approximating of the field lines is described in G.Polya, G.Szego, "Isoperimetric Inequalities in Mathematical Physics", Princeton. Princeton University Press, 1951, Section 1.29, page 49. The proposed method applies this field lines approach to the special case of long silicon chip wires as a 2-dimensional problem with the wires having cross sections which are composed of rectangles. More specifically, this method can be used for modelling capacitance of on-chip transmission lines.

Before calculating the capacitance matrix for each on-chip microstrip or coplanar transmission line topology separately, some basic components of the capacitance calculation methodology are introduced. This methodology consists of the following five basic steps:

1. Draw reasonable field lines for the investigated structure.

For the two coupled lines topologies, a first possible method is to assume the odd (differential) mode for the calculation of the field lines, in order to take the cross (mutual) capacitance into an account. The second possible method would be to plot separately the field lines for both the even (common) mode and another mode (such as single mode, etc.) and calculate the capacitance to ground in the two modes, from which the cross capacitance can be deduced. In this description, the first method is followed.

2. Calculate the length of each field line–$\int dl$.

3. Use the assumption that the electric field along the field line is constant.

This assumption is valid only for parallel field lines in dielectric regions with zero volume charge, as follows from Gauss law, and can be used as first order approximation in most of the practical cases.

Hence we can write:

$$V = \int E dl = E \int dl$$

$$E = \frac{V}{\int dl}$$

4. Calculate the charge of the defined area by using Gauss Law: $q = \int \epsilon * E * ds$ where S is a surface of the metal interface which collects the field lines.

5. Calculate the capacitance per unit length of the wire:

$$C = \frac{q}{V * l}$$

The transmission line topology's capacitance is calculated using the solutions of basic characteristic cases, which serve as building blocks. Each of the building blocks follows the above five basic steps for different field lines patterns. These five characteristic solutions or building blocks are described below with reference to FIGS. 2A to 2E. FIGS. 2A to 2E each show a cross-section of a transmission line 201 with field lines 202 to a ground structure 203.

1) Parallel plates capacitance. This is shown in FIG. 2A.

The above five steps are applied to this case with parallel plates capacitance for width=b and height=a $$\int dl = a$$

Equation (1)

$$q = \int_0^b \varepsilon * \frac{V}{a} * l * dx = \varepsilon * V * l * \frac{b}{a}$$

$$\frac{C}{\varepsilon} = \frac{b}{a}$$

Figure 2B:
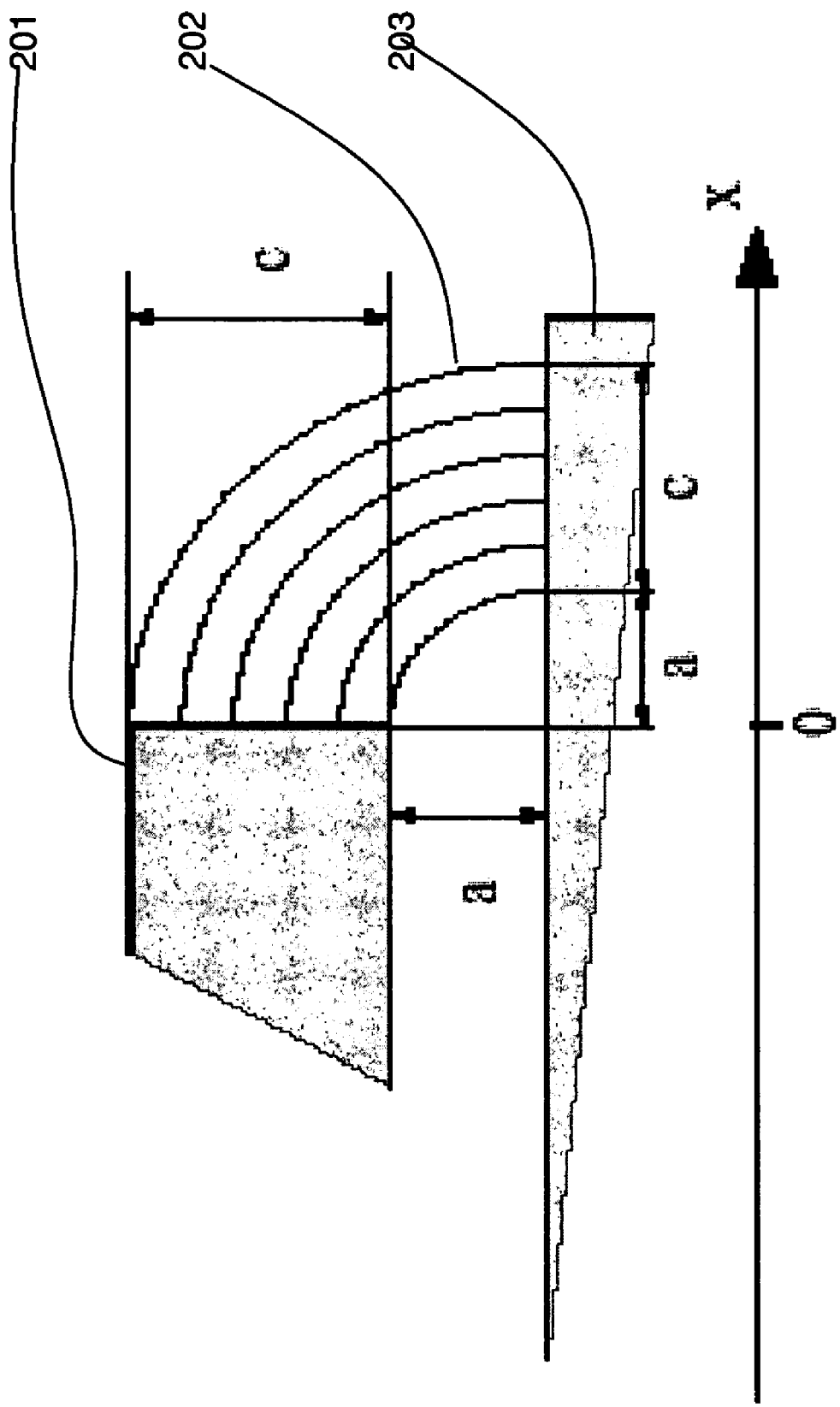

2) Quarter circle field lines. This is shown in FIG. 2B.

The above five steps are applied to this case of capacitance calculation for ¼ circle field lines.

$$\int dl = \frac{\pi}{2} * x$$

Equation (2)

$$q = \int_a^{a+c} \varepsilon * \frac{V}{(\pi/2) * x} * l * dx$$

$$= \varepsilon * V * l * \frac{2}{\pi} * \ln\left(1 + \frac{c}{a}\right)$$

$$\frac{C}{\varepsilon} = \frac{2}{\pi} * \ln\left(1 + \frac{c}{a}\right)$$

Figure 2C:
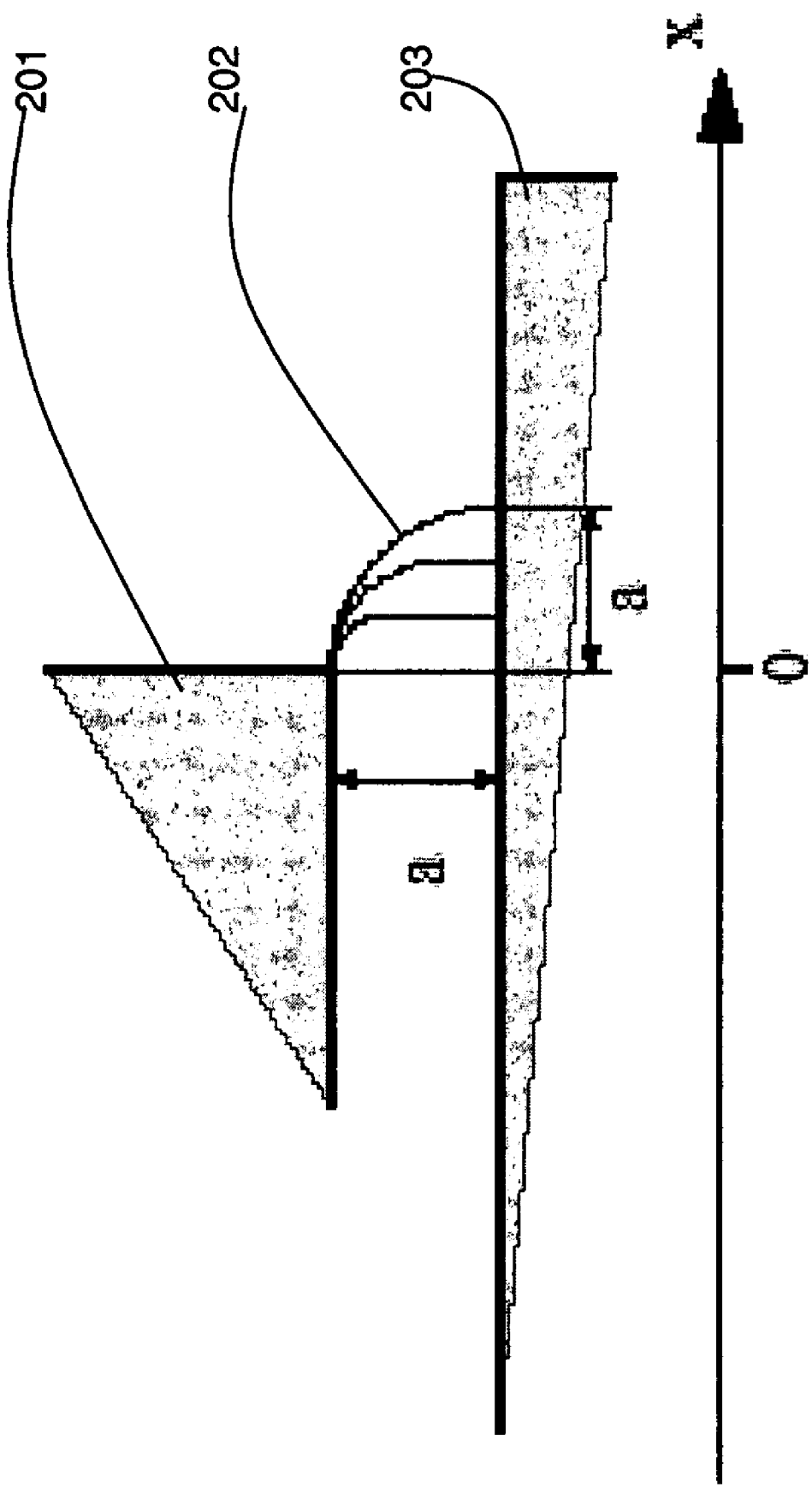

3) Singularity field lines. This is shown in FIG. 2C.

The above five steps are applied to this case of capacitance calculation for singularity field lines.

$$\frac{C}{\varepsilon} = \frac{2}{\pi - 2} * \ln\frac{\pi}{2}$$

Equation (3)

Figure 2D:
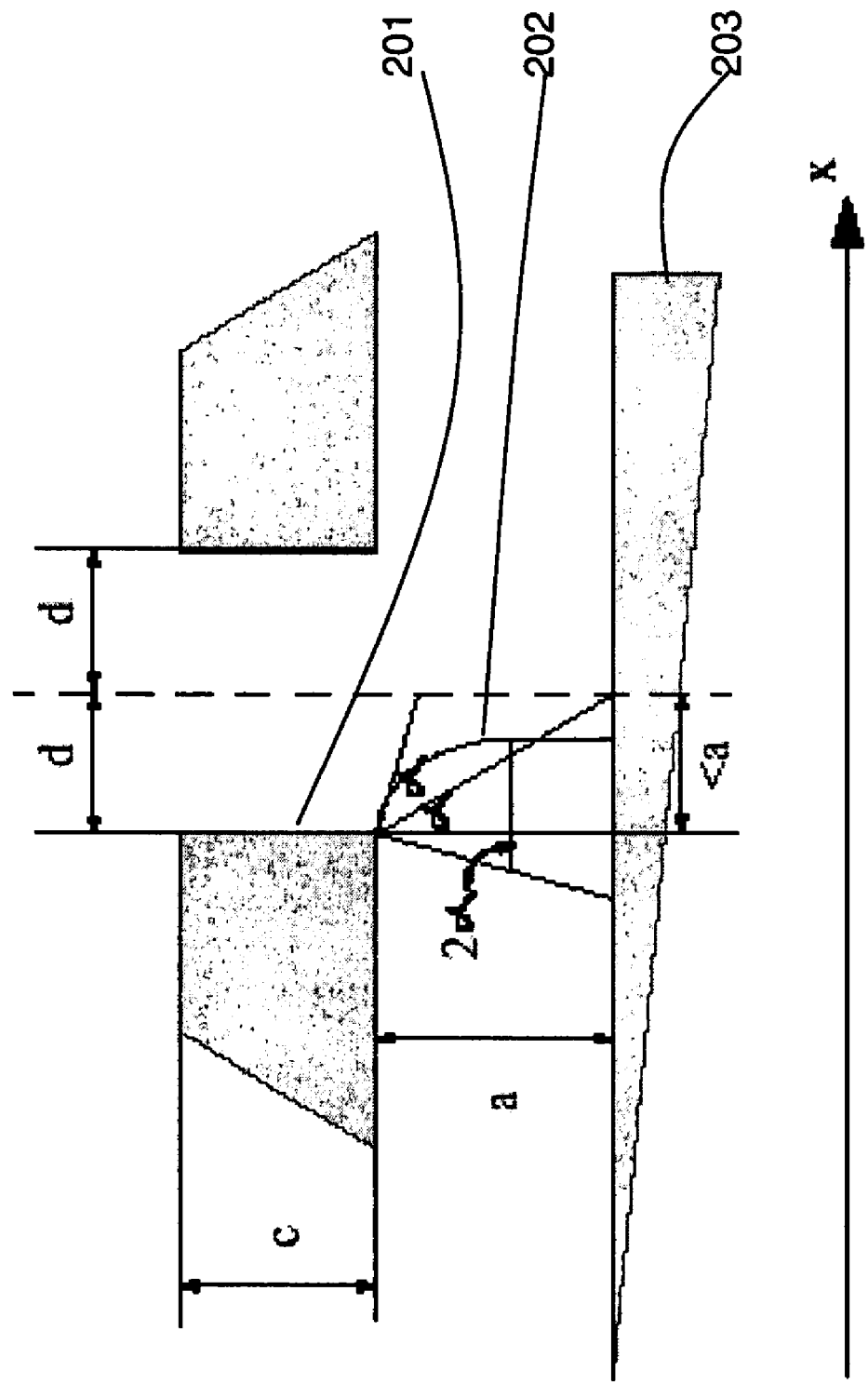

4) Singularity field lines with restriction. This is shown in FIG. 2D.

The above five steps are applied to this case of capacitance calculation of singularity field lines with restriction.

$$\alpha = a\tan\frac{d}{a}$$

Equation (4A)

$$\frac{C}{\varepsilon} = \frac{1 - \cos(2*\alpha)}{2*\alpha - \sin(2*\alpha)} * \ln\frac{2*\alpha}{\sin(2*\alpha)}$$

The above five steps are also applied to this case of capacitance (to right neighbour) calculation of singularity field with restriction.

$$\beta = \frac{\pi}{2} - \alpha$$

Equation (4B)

$$\frac{C_s}{\varepsilon} = \frac{1}{2} * \frac{1 - \cos(\beta)}{\beta - \sin(\beta)} * \ln\frac{\beta}{\sin(\beta)}$$

Figure 2E:
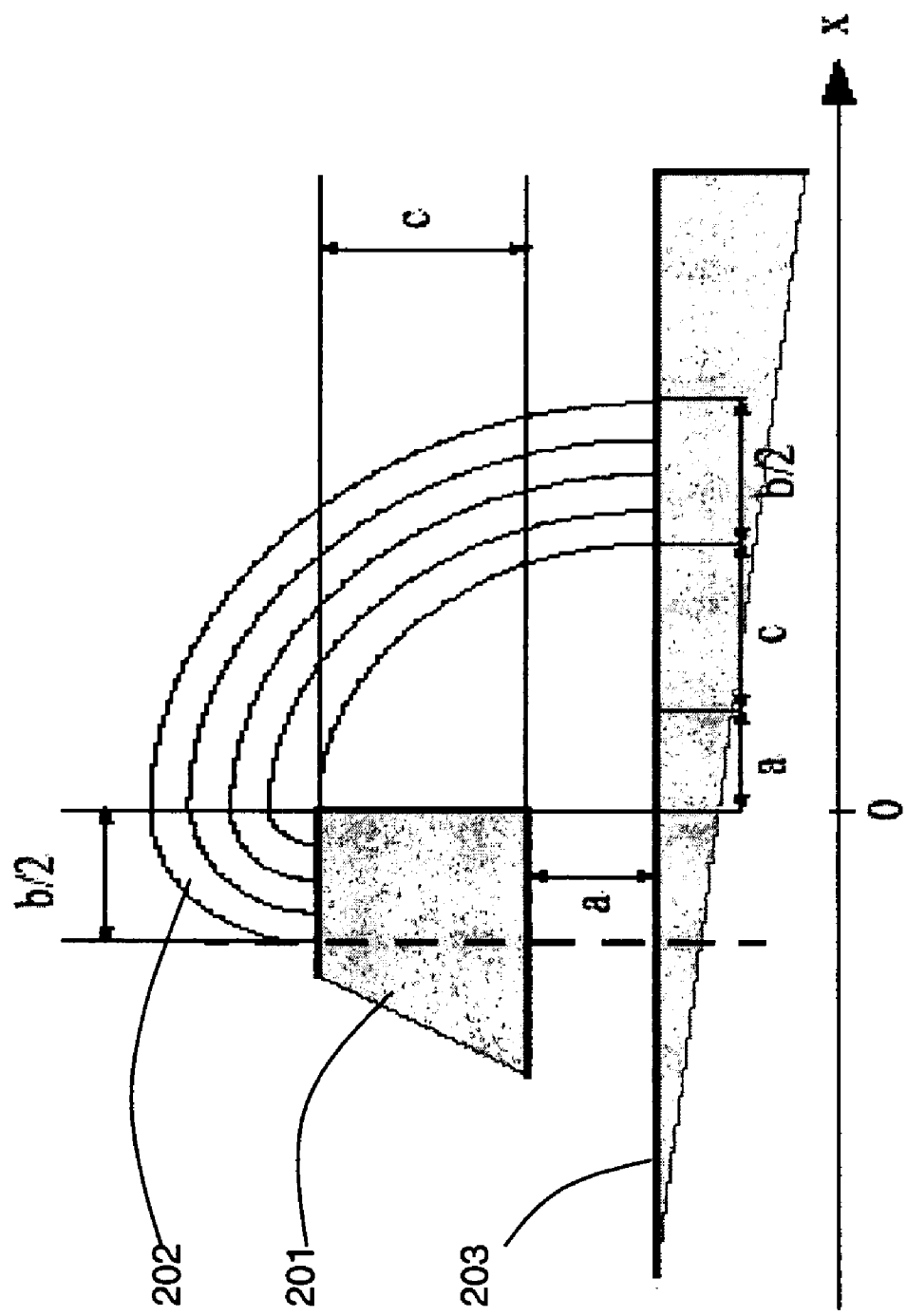

5) Double set of quarter circle lines. This is shown in FIG. 2E.

The above five steps are applied to this case of capacitance calculation for double set of quarter circle field lines $$\frac{C}{\varepsilon} = \frac{1}{\pi} * \ln\left(1 + \frac{b}{a+c}\right)$$

Equation (5)

It should be noted that the fifth characteristic solution is not used in the following presented calculations for T-lines with crossing lines. However, this solution is important for the derivation of capacitance in other cases of interest such as the case of crossing lines only below or cases where crossing lines do not exist.

The equations derived for the characteristic cases given above are used as building blocks to obtain the capacitance for a range of interconnect structures. As an exemplary embodiment, the method of calculation of capacitance for structures in the form of transmission lines with crossing lines is described.

The following assumption is made that the crossing lines are modeled as if they were a full solid plane. This serves as the worst case approximation, and becomes a good approximation when the distance between the crossing line plane and the signal line(s) is larger than the distance between the crossing lines themselves, which happens often in typical VLSI design.

The crossing lines are sufficiently long so it is possible to assume that they are practically grounded. This is justified since the capacitance of the whole crossing line to ground is usually much larger than the cross capacitance between the signal line(s) and the crossing line.

These assumptions reduce the problem to the following four two-ground problems, which can be applied to both the cases of microstrip and coplanar T-lines:

1. single signal line without side shields
2. single signal line with side shields
3. coupled signal lines without side shields
4. coupled signal lines with side shields These four structures are shown in FIGS. 3A to 3D.

Figure 3A:
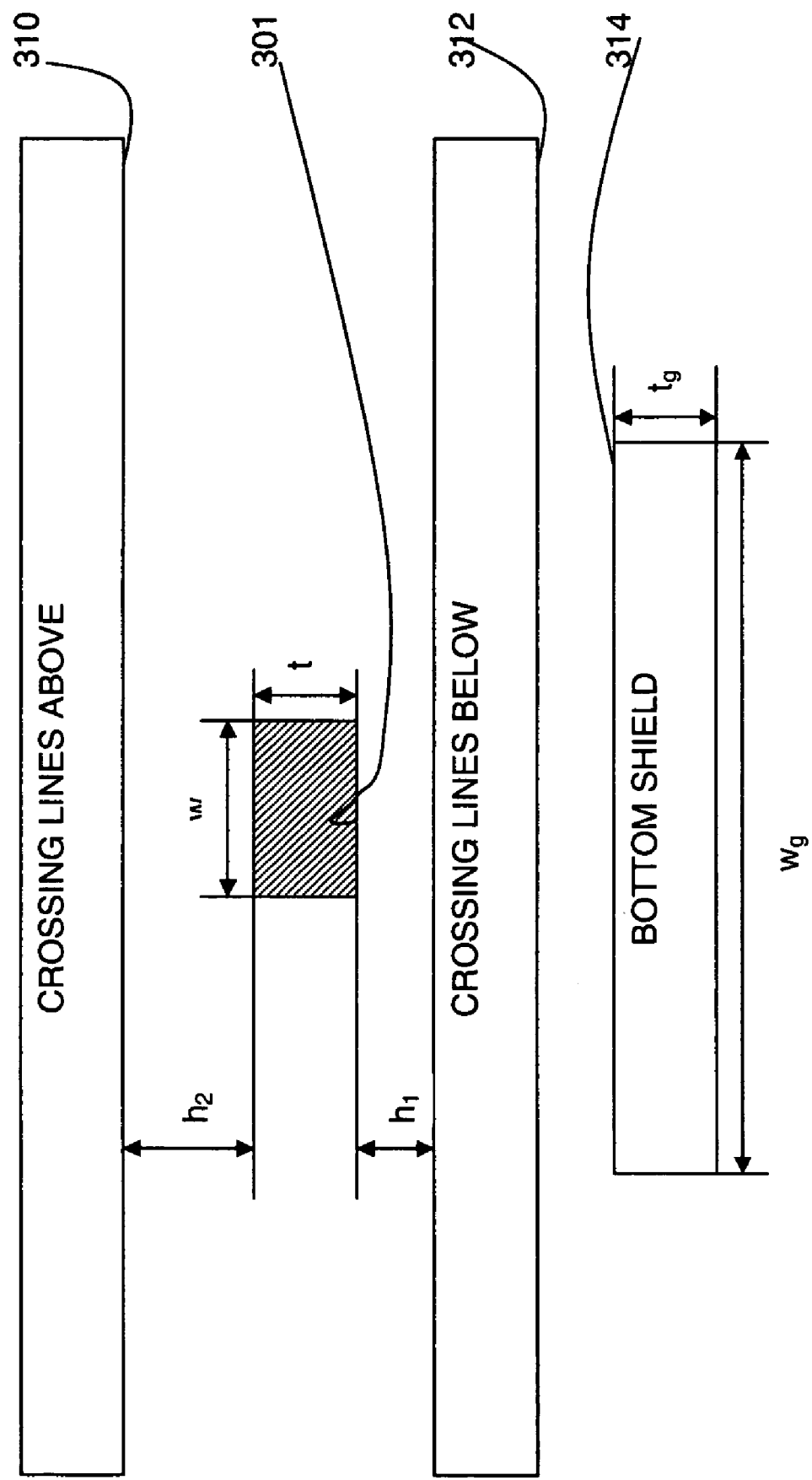
FIGS. 3A to 3D are cross-sections of transmission line topologies used in accordance with the present invention.

FIG. 3A shows a cross-section of a single signal line 301 with crossing lines above 310 and below 312 and a bottom shield 314. Dimensions are defined with the cross-section of the signal line having a width w and thickness t. The distance between the signal line 301 and the crossing line above 310 is defined as $h_2$ and the distance between the signal line 301 and the crossing line below 312 is defined as $h_1$. The bottom shield 314 has width $w_g$ and thickness $t_g$.

Figure 3B:
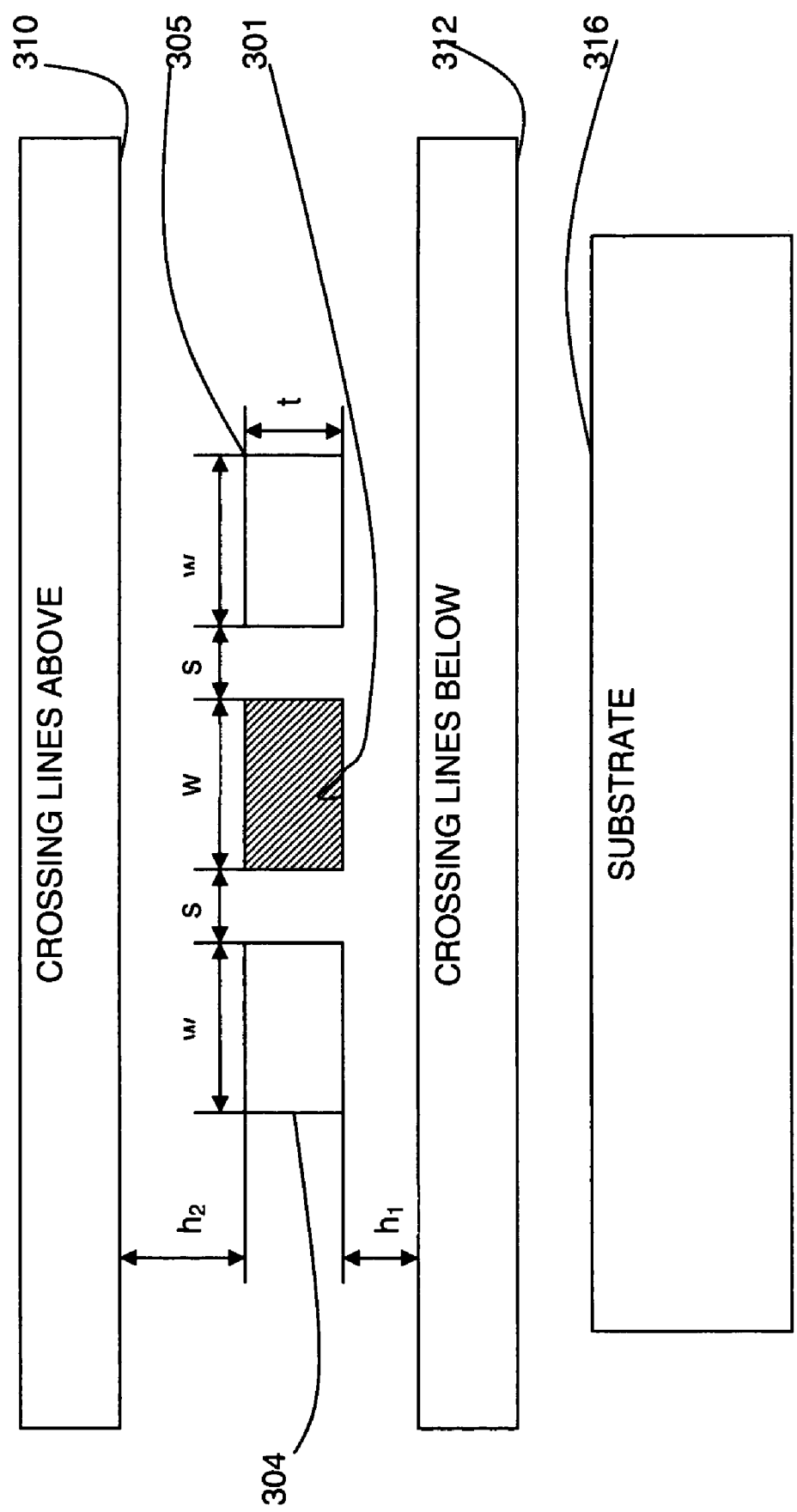

FIG. 3B shows a cross-section of a single signal line 301 with side shields 304, 305 and crossing lines above 310 and below 312 and a bottom substrate 316. There is a separation s between the signal line 301 and each of the side shields 304, 305.

Figure 3C:
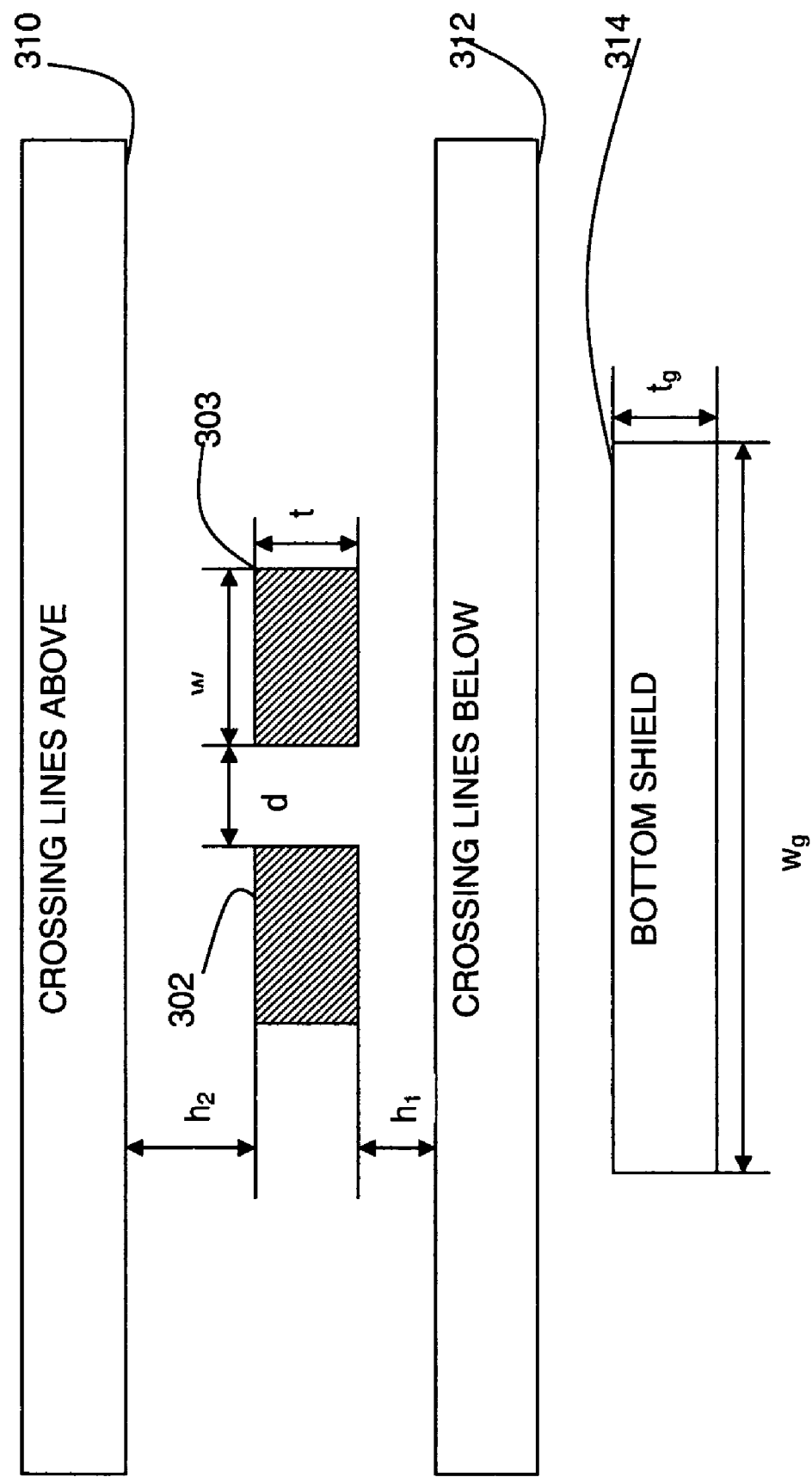

FIG. 3C shows a cross-section of two coupled lines 302, 303 with crossing lines above and below 310, 312 and a bottom shield 314. The two coupled lines 301, 302 have a distance d between them.

Figure 3D:
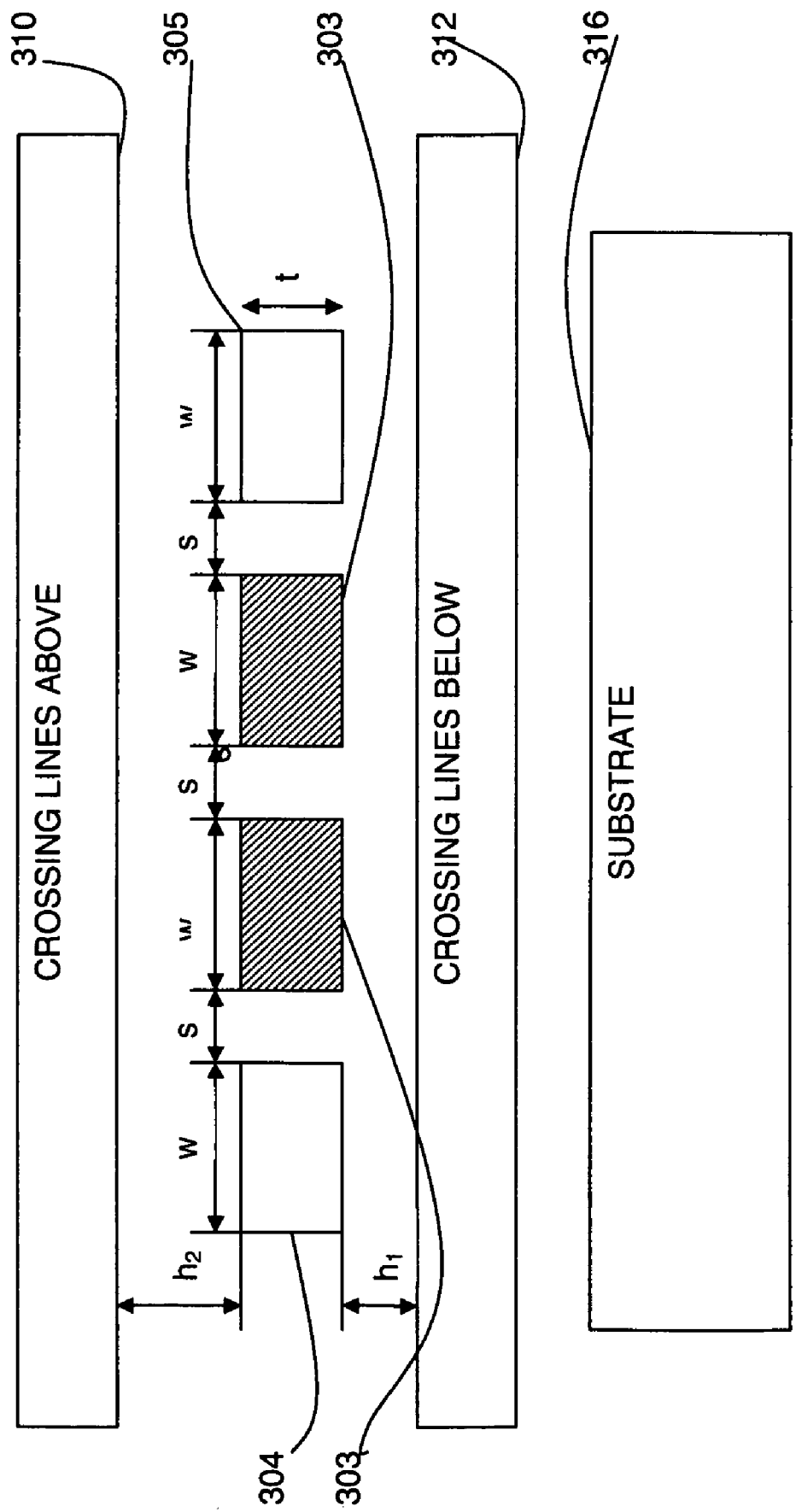

FIG. 3D is a cross-section of two coupled lines 302, 303 with side shields 304, 305 and crossing lines above 310 and below 312 and a bottom substrate 316. The two couple lines 301, 302 have a distance d between them and each have a separation s from its adjacent side shield 304, 305.

The method replaces each two-ground problem with two one-ground problems. For example, the case of a T-line with coupled signal lines 302, 303 and side shields 304, 305 shown in FIG. 3D is replaced by two one-ground problems, as shown in FIGS. 4A and 4B.

Figure 4A:
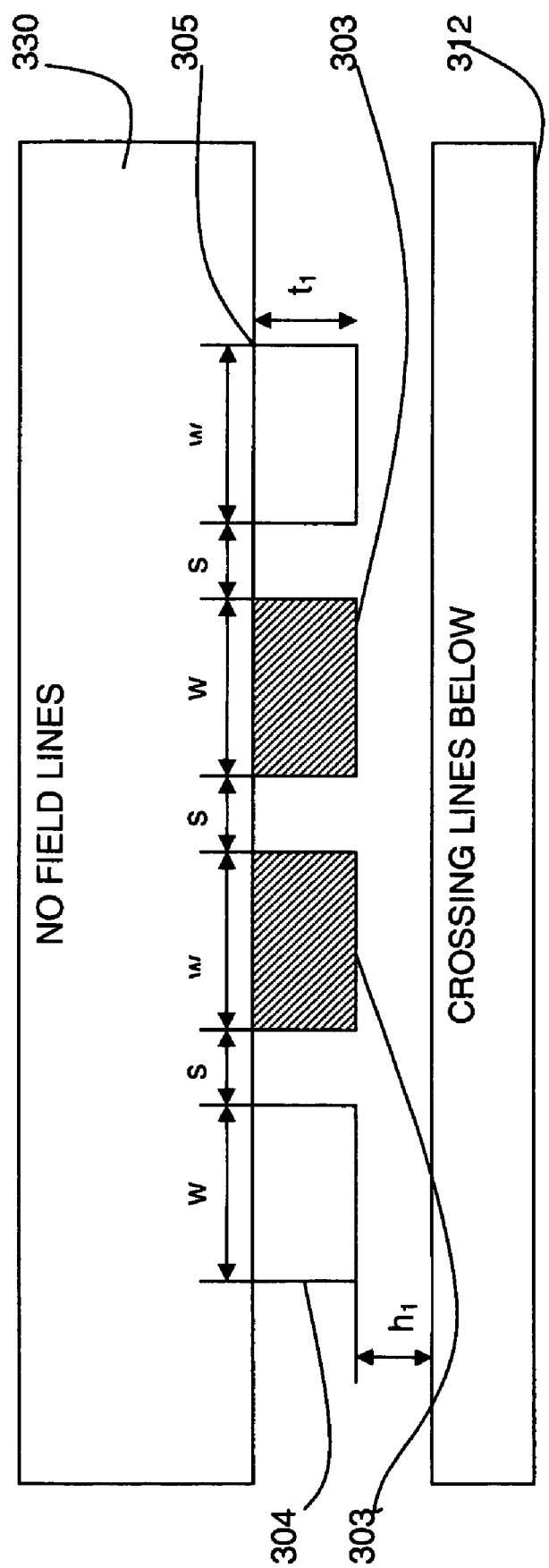
FIGS. 4A and 4B show cross-sections of the topology of FIG. 3D divided into two single ground topologies in accordance with an aspect of the invention.

In FIG. 4A, the cross-sections of two coupled signal lines 302, 303 and side shield lines 304, 305 are shown with the crossing line below 312 and no field lines above 330. In FIG. 4A, the crossing line below 312 is a distance $h_1$ from the signal lines 302, 202 and the signal lines have a thickness $t_1$.

Figure 4B:
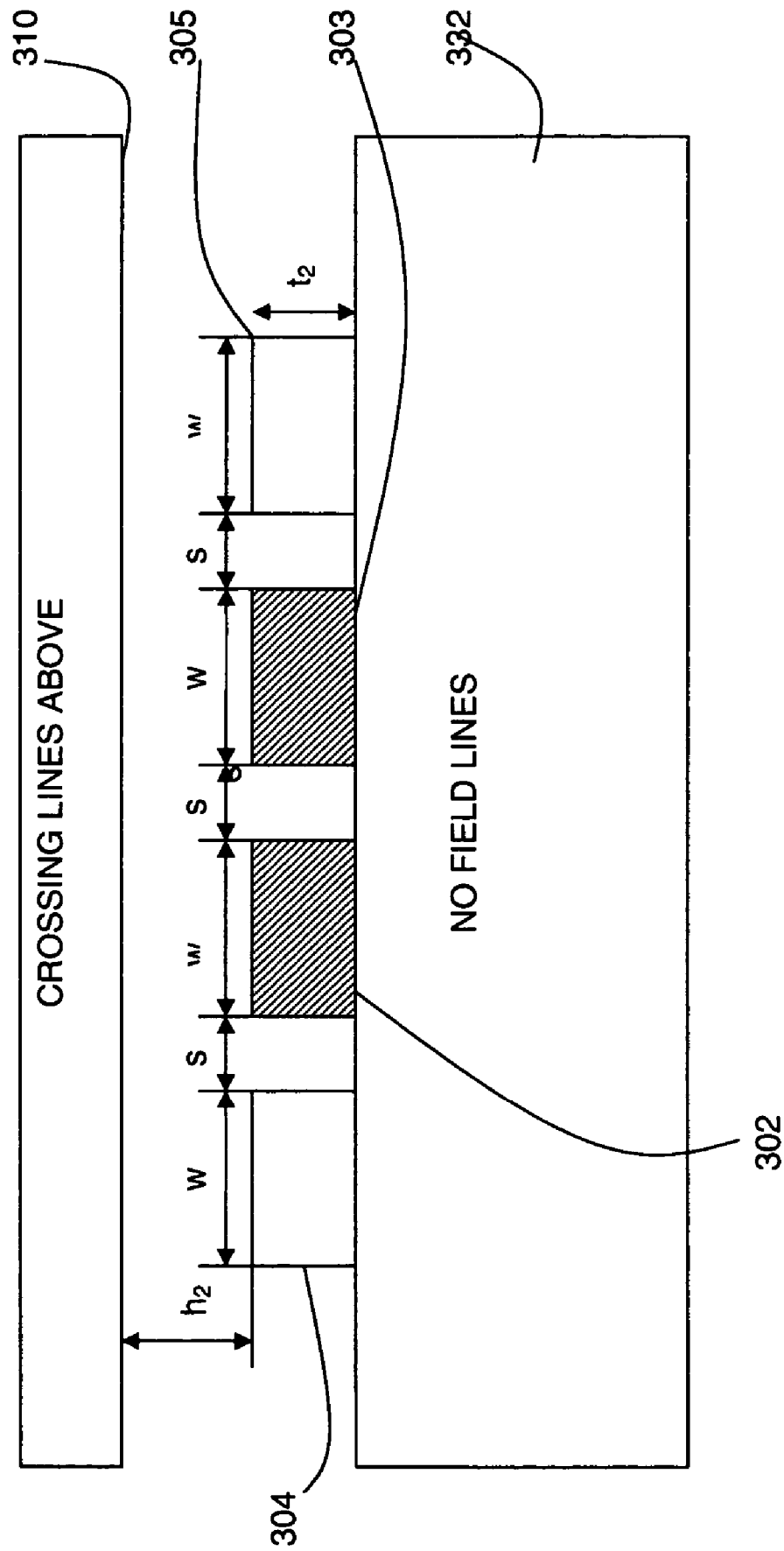

In FIG. 4B, the cross-sections of two coupled signal lines 302, 303 and side shield lines 304, 305 are shown with the crossing line above 310 and no field lines below 332. In FIG. 4B, the crossing line above 310 is a distance $h_2$ from the signal lines 302, 202 and the signal lines have a thickness $t_2$.

The dimensions $t_1$ and $t_2$ are defined as:

$$t_1 = t * \frac{h_2}{h_1 + h_2},$$

$$t_2 = t * \frac{h_1}{h_1 + h_2}$$

The full capacitance matrix is now approximated by the sum of the capacitance matrices of these two auxiliary problems. The problem of the crossing line below (FIG. 4B) differs from the problem of the crossing line above (FIG. 4A) only by the geometry parameters t and h, so it is sufficient to derive the capacitance expressions only for one of these problems.

Figure 5:
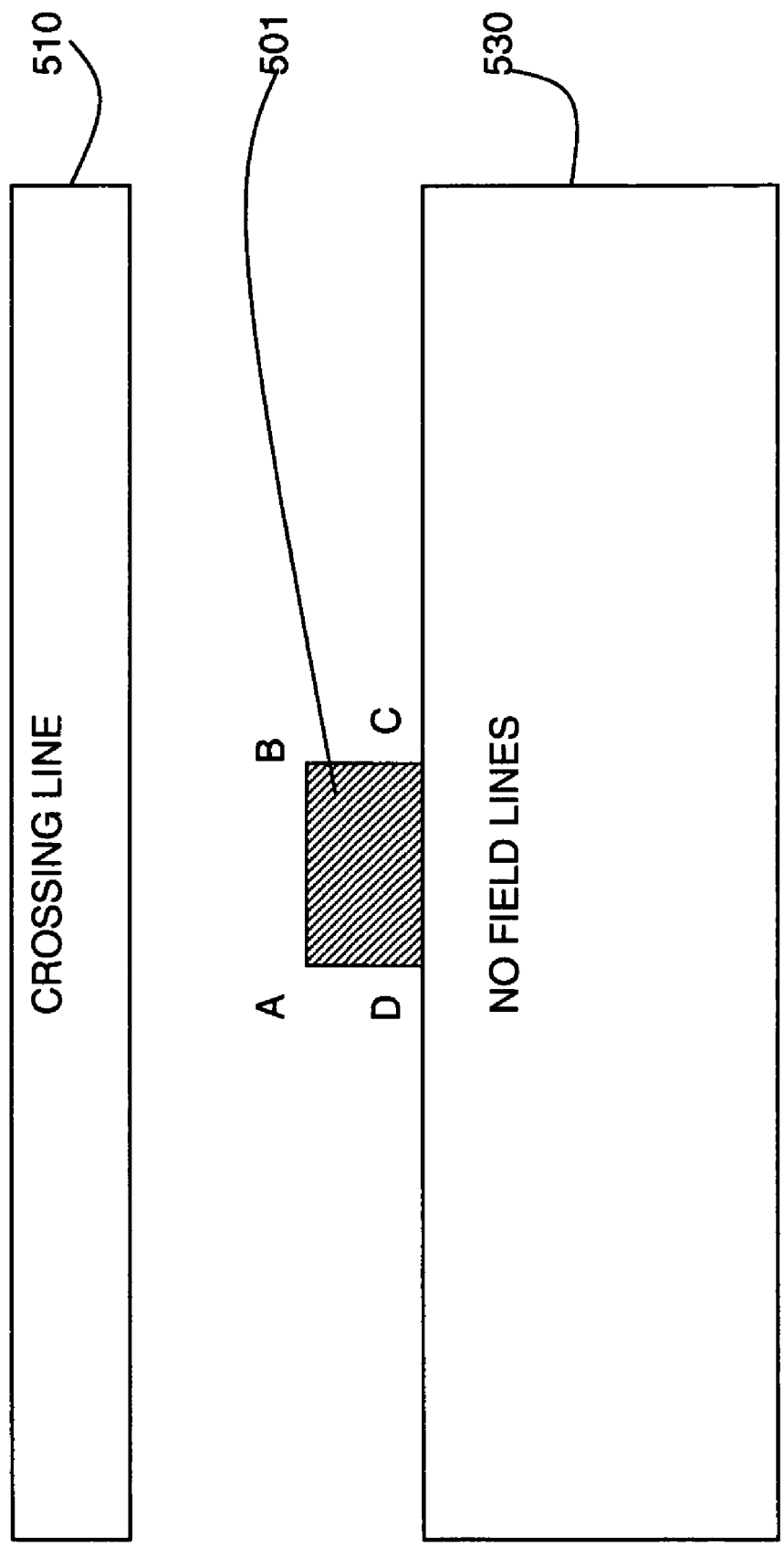
FIG. 5 is a cross-section of a transmission line showing the dimension references used in the description and equations.

FIG. 5 shows a single signal line 501 with a crossing line 510 above and no field lines 530 below. Each of the corners of the signal line 501 are labelled A, B, C, D as shown in FIG. 5. The capacitance to ground C for the one signal line 501 is the sum of the side and corner capacitances:

$$C = C_{AB} + C_A + C_B + C_{BC} + C_{AD}$$

Where $C_x$ is the capacitance of corner x, and $C_{xy}$ is the capacitance of the side xy. No field lines means that the capacitance on CD and corners C and D are assumed to be zero ($C_{CD}=0$, $C_C=0$, $C_D=0$) in this specific calculation.

Each of the corner and side capacitance are calculated using the characteristic structures defined previously as building blocks. In the example of FIG. 5, the following equations are used:

$C_{AB}$ uses Equation (1) for the parallel plates capacitance expression;
$C_A$ uses Equation (3) for singularity field lines;
$C_B$ uses Equation (3) for singularity field lines;
$C_{BC}$ uses Equation (2) for quarter circle field lines;
$C_{AD}$ uses Equation (2) for quarter circle field lines.
These equations were combined to give $$C = Eq(1) + 2*Eq(3) + 2*Eq(2) \quad \text{Equation (6)}$$

The corner capacitance constant was empirically found to be lower than the value calculated using Equation (3) and therefore an appropriate constant of 1.3 was inserted into the equation.

Below is the full set of capacitance expressions for the calculation of the crossing line above (FIG. 4B) and crossing line below (FIG. 4A) auxiliary problems. For calculating the "above" case, one should assign $h=h_2$, $t=t_2$ in the expressions below while for calculating the "below" case, one should assign $h=h_1$, $t=t_1$.

1. Single signal line without side shields, as shown in FIG. 3A. For each of the above and below cases, the following equation can be derived from Equation (6).

$$C = 2*\varepsilon * \left[ A*\frac{W}{2*h} + B*\frac{1.3}{\pi-2}*\ln\frac{\pi}{2} + C*\frac{2}{\pi}*\ln\left(1+\frac{t}{h}\right) \right]$$

As an example, this expression was used for a specific CMOS technology and compared on a random database of 100 cases (all having the same geometry with random parameters) with the exact numerical result obtained by EM solver. The results which were obtained were as follows:
Without fitting: A=B=C=1
average error=1.7%
max error=7.4%

A downhill simplex numerical optimization method (by Nedler and Mead) was performed in order to find the minimal value of the difference between the semi-analytical and the numerical exact results. The results for this specific example were as follows:
After fitting: A=1.0245, B=0.8922, C=1.3641
average error=1.07%
max error=1.8%

2. Single signal with side shields as shown in FIG. 3B.

As with the non-shielded single signal case, $C=C_{AB}+C_A+C_B+C_{BC}+C_{AD}$ and no field lines means that the capacitance on CD and corners C and D are assumed to be zero ($C_{CD}=0$, $C_C=0$, $C_D=0$).

Each of the corner and side capacitance is calculated using the characteristic structures defined previously as building blocks. In this case, the following equations are used:

$C_{AB}$ uses Equation (1) for the parallel plates capacitance expression;
$C_A$ uses Equations (4A) and (4B) for singularity field lines with restriction;
$C_B$ uses Equations (4A) and (4B) for singularity field lines with restriction;
$C_{BC}$ uses Equation (2) for quarter circle field lines;
$C_{AD}$ uses Equation (2) for quarter circle field lines.
These equations are combined.

Notations: $\alpha = 2*\mathrm{atan}\left(\frac{s}{2*h}\right)$, $\beta = \frac{\pi}{2} - \alpha$ Case: $s > 2*(h+t)$ $C =$ $$2*\varepsilon*\left[A*\frac{W}{2*h} + B*\frac{1.6}{\pi-2}*\ln\left(\frac{\pi}{2}\right) + C*\frac{2}{\pi}*\ln\left(1+\frac{t}{h}\right)\right]$$

Case: $2*h < s < 2*(h+t)$ $C =$ $$2*\varepsilon\left[A*\frac{W}{2*h} + B*\frac{1.6}{\pi-2}\ln\left(\frac{\pi}{2}\right) + C*\frac{2}{\pi}\ln\left(\frac{s}{2*h}\right) + D*\frac{2*(t+h)-s}{2*s}\right]$$

Case: $s < 2*h$ $C = 2*\varepsilon*\left[A*\frac{W}{2*h} + B*0.8*\frac{1-\cos(\alpha)}{\alpha-\sin(\alpha)}*\ln\frac{\alpha}{\sin(\alpha)} + \right.$ $$\left. D*\frac{t}{s} + E*0.4*\frac{1-\cos(\beta)}{\beta-\sin(\beta)}*\ln\frac{\beta}{\sin(\beta)}\right]$$

For 100 random examples the following results were obtained:
Without fitting: A=B=C=D=E=1
average error=3.5%
max error=12.4%
After fitting: A=1.0397, B=0.7840, C=1.2023, D=1.1923, E=1.5187
average error=3.18%
max error=2.03%

3. Two coupled signal lines without side shields as shown in FIG. 3C. Again, using the building blocks, the following equations can be derived.

Calculation of capacitance C and mutual capacitance Cm:
3.1 Calculation of the capacitance C:

$$C = Cleft + Cright$$

Notations: $\alpha = 2*\text{atan}\left(\dfrac{d}{2*h}\right), \beta = \dfrac{\pi}{2} - \alpha$ Calculation of Cleft:

$$Cleft = \varepsilon * \left[A * \dfrac{W}{2*h} + B * \dfrac{1.3}{\pi - 2} * \ln\dfrac{\pi}{2} + C * \dfrac{2}{\pi} * \ln\left(1 + \dfrac{t}{h}\right)\right]$$

Calculation of Cright:

Case: $d > 2*(h+t)$ Cright =

$$\varepsilon * \left[A * \dfrac{W}{2*h} + B * \dfrac{1.6}{\pi - 2} * \ln\dfrac{\pi}{2} + C * \dfrac{2}{\pi} * \ln\left(1 + \dfrac{t}{h}\right)\right]$$

Case: $2*h < d < 2*(h+t)$ Cright =

$$\varepsilon * \left[A * \dfrac{W}{2*h} + B * \dfrac{1.6}{\pi - 2} * \ln\dfrac{\pi}{2} + C * \dfrac{2}{\pi} * \ln\dfrac{d}{2*h}\right]$$

Case: $d < 2*h$ Cright = $\varepsilon\left[A * \dfrac{W}{2*h} + B * 0.8 * \dfrac{1 - \cos(\alpha)}{\alpha - \sin(\alpha)} * \ln\dfrac{\alpha}{\sin(\alpha)}\right]$ 3.2 Calculation of the Mutual Capacitance Cm:

Case: $d > 2*(h+t)$ Cm = 0

Case: $2*h < d < 2*(h+t)$ Cm = $\varepsilon * D * \dfrac{2*t + 2*h - d}{2*d}$

Case: $d < 2*h$ Cm = $\varepsilon * \left[D * \dfrac{t}{d} + E * 0.4 * \dfrac{1 - \cos(\beta)}{\beta - \sin(\beta)} * \ln\dfrac{\beta}{\sin(\beta)}\right]$ Verification of Even Mode Capacitance (C)
For 100 random examples the results obtained were:
Without fitting: A=B=C=1
average error=1.16%
max error=7.75%
After fitting: A=0.9748, B=0.9460, C=1.2230
average error=1.84%
max error=5.18%
Verification of Odd Mode Capacitance (C+2 Cm)
For 100 random examples the results obtained were:
Without fitting: A=B=C=D=E=1
average error=2.1%
max error=13.3% (only for 2 examples max error>13.3%)
After fitting: A=1.0579, B=0.8538, C=0.5857, D=1.5056, E=1.2980
average error=2.0%
max error=6.07%

4. Coupled signals with side shields as shown in FIG. 3D and FIGS. 4A and 4B.

Again, using the building blocks, the following equations can be derived.

Calculation of capacitance C and the cross capacitance Cm:

4.1 Calculation of the Capacitance C:

$C = Cleft + Cright + Cs$

Notations:

$\alpha_d = 2*\text{atan}\left(\dfrac{d}{2*h}\right), \beta_d = \dfrac{\pi}{2} - \alpha_d$ $\alpha_s = 2*\text{atan}\left(\dfrac{s}{2*h}\right), \beta_s = \dfrac{\pi}{2} - \alpha_s$ Calculation of Cleft:

Case: $s > 2*(h+t)$ Cleft =

$$\varepsilon * \left[A * \dfrac{W}{2*h} + B * \dfrac{1.6}{\pi - 2} * \ln\dfrac{\pi}{2} + C\dfrac{2}{\pi} * \ln\left(1 + \dfrac{t}{h}\right)\right]$$

Case: $2*h < s < 2*(h+t)$ Cleft =

$$\varepsilon * \left[A * \dfrac{W}{2*h} + B * \dfrac{1.6}{\pi - 2} * \ln\dfrac{\pi}{2} + C * \dfrac{2}{\pi} * \ln\dfrac{s}{2*h}\right]$$

Case: $s < 2*h$ Cleft = $\varepsilon\left[A * \dfrac{W}{2*h} + B * 0.8 * \dfrac{1 - \cos(\alpha_s)}{\alpha_s - \sin(\alpha_s)} * \ln\dfrac{\alpha_s}{\sin(\alpha_s)}\right]$ Calculation of Cright:

Case: $d > 2*(h+t)$ Cright =

$$\varepsilon * \left[A * \dfrac{W}{2*h} + B * \dfrac{1.6}{\pi - 2} * \ln\dfrac{\pi}{2} + C * \dfrac{2}{\pi} * \ln\left(1 + \dfrac{t}{h}\right)\right]$$

Case: $2*h < d < 2*(h+t)$ Cright =

$$\varepsilon * \left[A * \dfrac{W}{2*h} + B * \dfrac{1.6}{\pi - 2} * \ln\dfrac{\pi}{2} + C * \dfrac{2}{\pi} * \ln\dfrac{d}{2*h}\right]$$

Case: $d < 2*h$ Cright = $\varepsilon\left[A * \dfrac{W}{2*h} + B * 0.8 * \dfrac{1 - \cos(\alpha_d)}{\alpha_d - \sin(\alpha_d)} * \ln\dfrac{\alpha_d}{\sin(\alpha_d)}\right]$ Calculation of Cs:

Case: $s > 2*(h+t)$ Cs = 0

Case: $2*h < s < 2*(h+t)$ Cs = $\varepsilon * D * \dfrac{2*t + 2*h - s}{2*s}$

Case: $s < 2*h$ Cs = $\varepsilon * \left[D * \dfrac{t}{s} + E * 0.4 * \dfrac{1 - \cos(\beta_s)}{\beta - \sin(\beta_s)} * \ln\dfrac{\beta_s}{\sin(\beta_s)}\right]$ 4.2 Calculation of the Cross Capacitance Cm:

Case: $d > 2*(h+t)$ Cm = 0

Case: $2*h < d < 2*(h+t)$ Cm = $\varepsilon * F * \dfrac{2*t + 2*h - d}{2*d}$

Case: $d < 2*h$ Cm = $\varepsilon * \left[F * \dfrac{t}{d} + G * 0.4 * \dfrac{1 - \cos(\beta d)}{\beta - \sin(\beta d)} * \ln\dfrac{\beta d}{\sin(\beta d)}\right]$ Verification of Even Mode Capacitance (C)
For 100 random examples the results obtained were:
Without fitting: A=B=C=D=E=1
average error=3.9%
max error=13.08%
After fitting: A=1.0766, B=0.7651, C=0.7713, D=1.1246, E=1.540
average error=3.5%
max error=5.65%

Verification of Odd Mode Capacitance (C+2 Cm):
For 100 random examples the results obtained were:
Without fitting: A=B=C=D=E=F=G=1
    average error=3.9%
    max error=15.5%
After fitting: A=1.0770, B=0.6005, C=1.2745, D=1.0045, E=1.1555, F=1.3049, G=1.2242
    average error=3.2%
    max error=6.4%

The above description provides examples of the derivation of capacitance expressions for interconnect structures. The expressions and the method of derivation may be provided as a computer program product for use in an IC design system as shown in FIG. 1.

Figure 6:
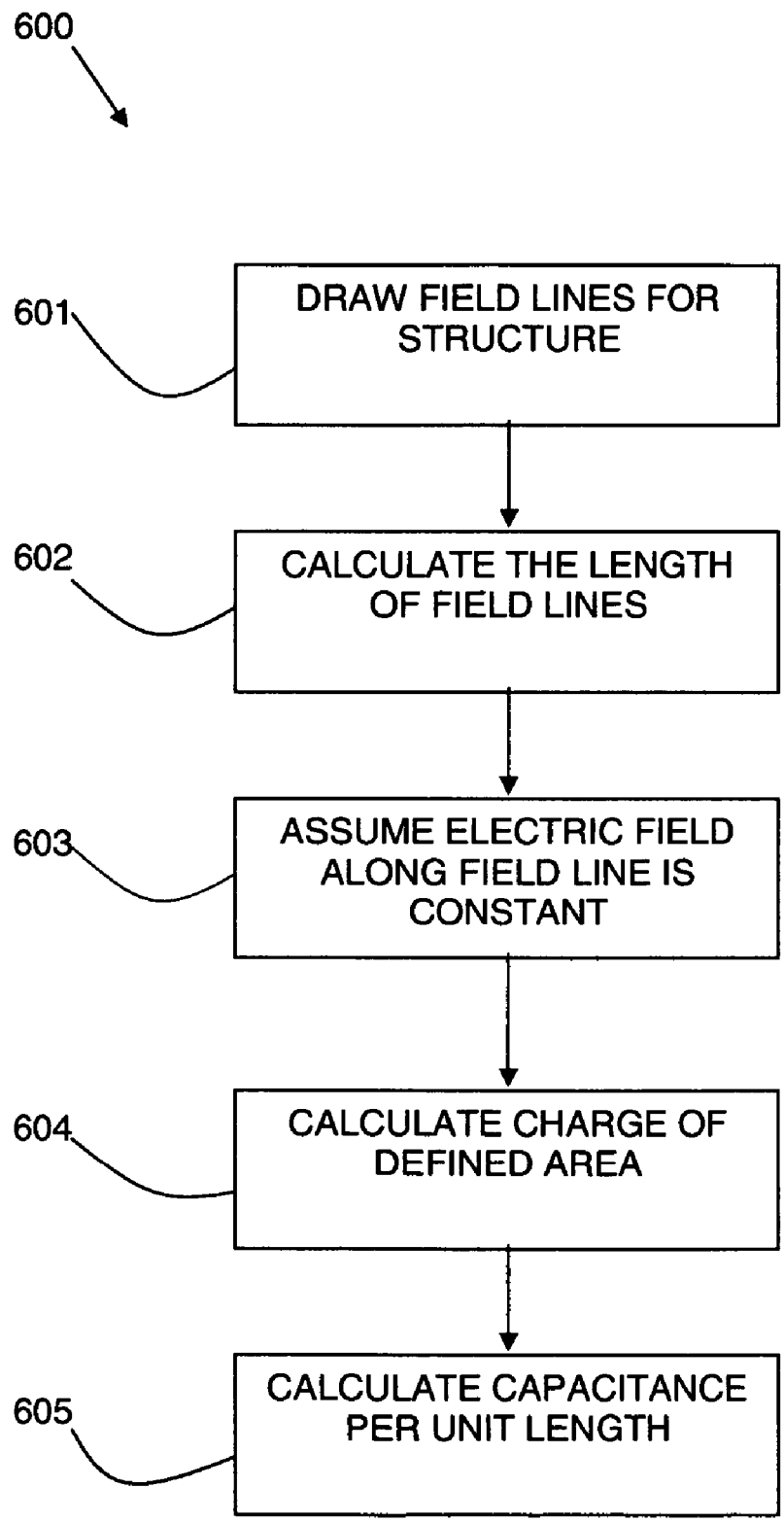
FIG. 6 is a flow diagram of a method of modeling capacitance in accordance with an aspect of the present invention.

Referring to FIG. 6, a flow diagram 600 of the basic five steps for deriving a capacitance expression for a field lines structure. The flow diagram 600 shows the five steps as follows:

1. Draw approximate field lines for a structure 601.
2. Calculate the length of each field line 602.
3. Assume that the electric field along the field line is constant 603.
4. Calculate the charge of the defined area 604.
5. Calculate the capacitance per unit length of the wire 605.

These five steps of FIG. 6 can be applied for the closed form solution of variety of cases. In particular, they are used to provide capacitance expressions for structural components which are used as building blocks for expressions for different interconnect structures. It should be noted that for non-rectangular structures, such as coaxial cables, the method can still be applied by modifying step 3 to assume a linear change of the electric field along the non-parallel field lines.

Figure 7A:
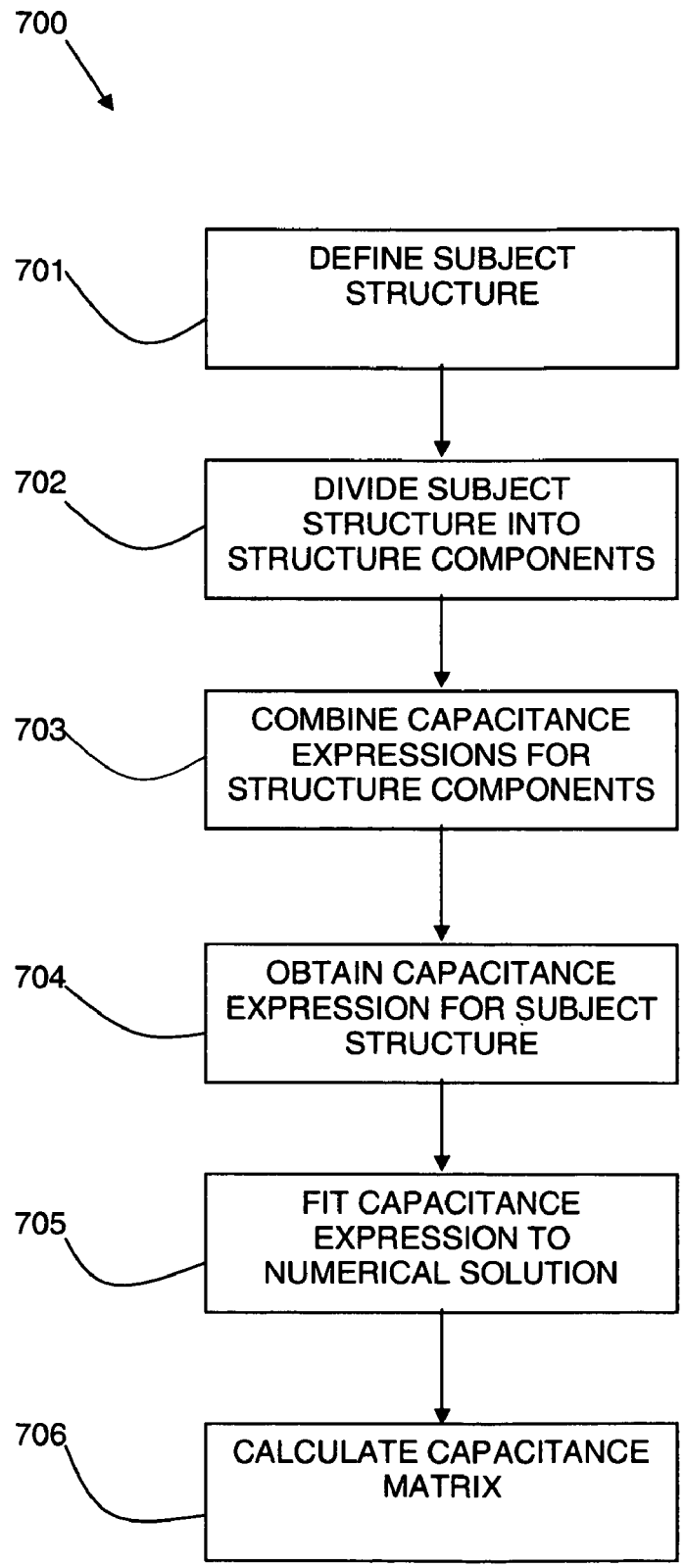
FIGS. 7A and 7B are flow diagram of methods of modeling capacitance in accordance with aspects of the present invention.

Referring to FIG. 7A, a flow diagram of a method of modeling capacitance 700 for an interconnect structure is shown. As a first step, a subject structure is defined 701. The subject structure is divided into characteristic components 702. The capacitance expressions for each characteristic component are combined 703. An a capacitance expression for the subject structure is obtained 704. Optionally, the capacitance expression can be fitted 705 using numerical results for the defined structure. The capacitance matrix can be calculated 706 using the capacitance expression.

Figure 7B:
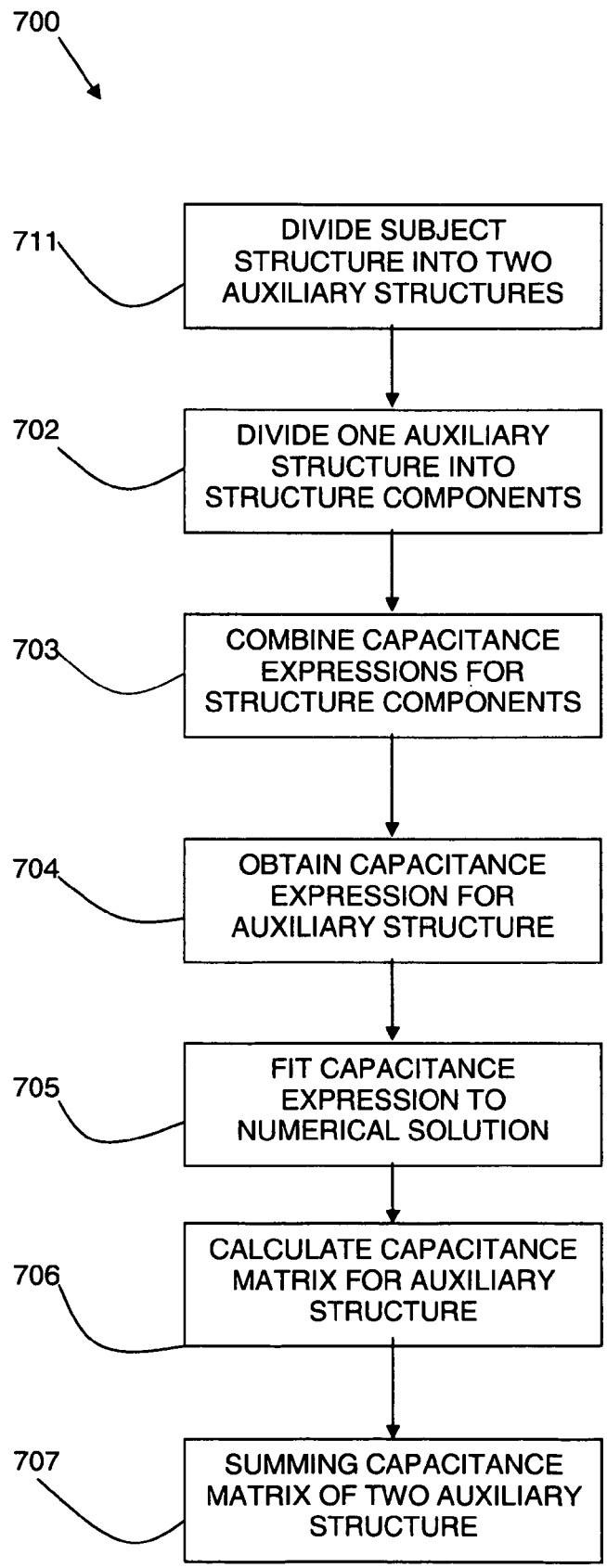

Referring to FIG. 7B, a flow diagram is shown for a method of modeling capacitance 710 for a two-ground structure. As a first step, the two-ground structure is divided into two auxiliary structures 711 and the method steps 702 to 706 are carried out for one of the auxiliary structures. At an additional step 707, the full capacitance matrix for the two-ground structure is approximated by summing the capacitance matrices of the two auxiliary structures.

A set of formulas is derived for all important cases of on-chip interconnect structures: single signal line without side shields, single signal line with side shields, two coupled signal lines without side shields, and two coupled signal lines with side shields.

This method enables the easy generalization of this solution to other similar structures, following the same top-down methodology rather than relying on arbitrary functions or massive numerical calculations.

If the accuracy of the calculated capacitance expressions as derived does not meet required accuracy standards, the accuracy can be further improved by fitting the expressions to exact EM solver results calculated on a proper database of geometries. This "fitting" methodology is performed by adding factors to the capacitance expression building blocks and using standard optimization algorithms to find the optimal vector of factors which minimizes the errors.

The process of fitting can be repeated for every silicon chip technology for maximal accuracy, or it can be performed only once for a generalised global metallization stack covering a large variety of existing technologies. If higher accuracy is desired, it is proposed to divide the mathematical space created by the given variation of the wire structure dimensions (w, t, h . . . ) into several sub-spaces, so that for each and every sub-space separate fitting of the capacitance expressions to the corresponding exact EM solver results is performed The method is easily extendible to cases where crossing lines appear only above (or only below) the signal line(s) or for cases where the crossing lines do not exist at all.

Since this method gives the capacitance matrix solution both for the worst case (full plane crossing) and for the best case (no crossing lines at all) we are using these two extreme solutions as a basis for interpolating any intermediate case with low density crossing. This can be achieved by introducing a linear crossing capacitance factor (between zero to one, or as a percentage), which can be used by the designers to estimate cases with low density of crossing lines.

The accuracy of the expressions is below 10% error without any fitting to a specific chip technology—and the error can be reduced to less than 5% when performing fitting to a global numerical database (which is the same for a large variety of silicon chip technologies). The field lines based semi-analytical capacitance solution is a cheap, robust and accurate solution which is also simple for usage and future extension.

The present invention is typically implemented as a computer program product, comprising a set of program instructions for controlling a computer or similar device. These instructions can be supplied preloaded into a system or recorded on a storage medium such as a CD-ROM, or made available for downloading over a network such as the Internet or a mobile telephone network.

Improvements and modifications can be made to the foregoing without departing from the scope of the present invention.

We claim:

1. A method of modeling capacitance for a subject structure, comprising:
    using a field lines approach to obtain capacitance expressions for structure components;
    combining the expressions for components of the subject structure; and
    obtaining a capacitance expression for the subject structure, wherein the step of using a field lines approach to obtain capacitance expressions for structure components includes:
    drawing approximate field lines for the structure component;
    calculating the length of each field line;
    assuming that the electric field along the field line is constant or has a linear variation;
    calculating the charge of a defined area; and
    calculating the capacitance per unit length of a wire.

2. A method of modeling capacitance for a subject structure, comprising:
    using a field lines approach to obtain capacitance expressions for structure components;
    combining the expressions for components of the subject structure; and
    obtaining a capacitance expression for the subject structure, wherein the subject structure is a coplanar or microstrip on-chip interconnect structure, and wherein the subject structure has crossing lines which are modeled as solid plates, and wherein the subject structure has two-ground crossing lines and the method includes dividing the subject structure into two one-ground auxiliary structures and obtaining a capacitance expression for one auxiliary structure.

3. A computer program product stored on a computer readable storage medium, comprising computer readable program code means for modeling capacitance for a subject structure, comprising code means for performing the steps of:

using a field lines approach to obtain capacitance expressions for structure components combining the expressions for components of the subject structure; and obtaining a capacitance expression for the subject structure, wherein the step of using a field lines approach to obtain capacitance expressions for structure components includes:

drawing approximate field lines for the structure component;

calculating the length of each field line;

assuming that the electric field along the field line is constant or has a linear variation;

calculating the charge of a defined area; and calculating the capacitance per unit length of a wire.

* * * * *